(12) United States Patent
Bryant

(10) Patent No.: US 10,260,723 B1
(45) Date of Patent: Apr. 16, 2019

(54) HIGH-LUMEN FIXTURE THERMAL MANAGEMENT

(71) Applicant: Christopher Michael Bryant, Social Circle, GA (US)

(72) Inventor: Christopher Michael Bryant, Social Circle, GA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 607 days.

(21) Appl. No.: 14/861,897

(22) Filed: Sep. 22, 2015

(51) Int. Cl.
| | |
|---|---|
| *F21V 23/00* | (2015.01) |
| *F21V 29/10* | (2015.01) |
| *F21V 29/77* | (2015.01) |
| *F21V 29/83* | (2015.01) |
| *H05K 7/20* | (2006.01) |

(52) U.S. Cl.
CPC ............ *F21V 29/10* (2015.01); *F21V 23/002* (2013.01); *F21V 29/773* (2015.01); *F21V 29/83* (2015.01); *H05K 7/20127* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467; F21V 29/10; F21V 29/773; F21V 29/83; F21V 23/002
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 8,110,973 | B2 * | 2/2012 | Richard | .................... H01J 5/48 313/113 |
| 9,811,985 | B2 * | 11/2017 | Lutz | .......................... G08B 5/36 |
| 2004/0120156 | A1 * | 6/2004 | Ryan | ..................... F21V 29/004 362/373 |
| 2007/0285924 | A1 * | 12/2007 | Morris | .................. F21V 29/004 362/264 |
| 2009/0290364 | A1 * | 11/2009 | Thomas | ..................... F21S 8/06 362/404 |
| 2010/0060130 | A1 * | 3/2010 | Li | ......................... F21V 29/004 313/46 |
| 2011/0110095 | A1 * | 5/2011 | Li | ......................... F21V 29/004 362/294 |
| 2011/0193464 | A1 * | 8/2011 | Plawski | .................... H01J 7/24 313/47 |

(Continued)

OTHER PUBLICATIONS

"Phuzion: LED Light Bay". Holophane Leader in Lighting Solutions. p. 1-5. www.holophane.com.

*Primary Examiner* — Robert J Hoffberg
*Assistant Examiner* — Razmeen Gafur
(74) *Attorney, Agent, or Firm* — King & Spalding LLP

(57) ABSTRACT

A lighting fixture structure for a suspended lighting fixture includes an electronics housing for containing lighting electronics. The lighting fixture structure further includes a thermal barrier positioned around a portion of the electronics housing. The lighting fixture structure also includes a heat sink. The electronics housing is separated from the thermal barrier by a first air gap, and the thermal barrier is separated from the heat sink by a second air gap.

20 Claims, 7 Drawing Sheets

(56) References Cited

U.S. PATENT DOCUMENTS

| | | | | |
|---|---|---|---|---|
| 2011/0227471 | A1* | 9/2011 | Richard | H01J 5/48 313/113 |
| 2012/0018212 | A1* | 1/2012 | Wu | F21V 21/104 174/40 R |
| 2012/0147600 | A1* | 6/2012 | Li | F21V 29/004 362/231 |
| 2012/0212960 | A1* | 8/2012 | Rodriguez | F21V 29/02 362/249.02 |
| 2013/0082600 | A1* | 4/2013 | Ter-Hovhanissian | F21K 9/23 315/112 |
| 2013/0250585 | A1* | 9/2013 | Le Toquin | H01L 33/08 362/373 |
| 2014/0126190 | A1* | 5/2014 | Dixon | F21L 4/00 362/190 |
| 2014/0268730 | A1* | 9/2014 | Lui | F21V 23/008 362/227 |
| 2014/0268864 | A1* | 9/2014 | Lee | G02B 6/0085 362/558 |
| 2015/0009690 | A1* | 1/2015 | Simon | F21V 23/009 362/382 |
| 2015/0176817 | A1* | 6/2015 | Olsson | F21V 15/01 362/249.02 |
| 2015/0252965 | A1* | 9/2015 | Edwards | B29C 47/0004 362/84 |
| 2015/0252982 | A1* | 9/2015 | Demuynck | F21S 9/022 362/184 |
| 2015/0252993 | A1* | 9/2015 | Stanley | H01J 61/22 362/264 |
| 2015/0300610 | A1* | 10/2015 | DeCarr | F21S 8/061 362/249.07 |
| 2016/0010806 | A1* | 1/2016 | Yang | F21V 3/02 362/84 |
| 2016/0076743 | A1* | 3/2016 | Deutsch | F21V 7/0091 362/268 |
| 2016/0076746 | A1* | 3/2016 | Porciatti | F21V 29/76 362/404 |
| 2016/0123571 | A1* | 5/2016 | Chan | F21V 29/83 362/249.01 |
| 2016/0273720 | A1* | 9/2016 | Livesay | H01L 33/641 |
| 2016/0273747 | A1* | 9/2016 | Verfuerth | F21V 21/116 |
| 2016/0327252 | A1* | 11/2016 | Ray | F21V 21/008 |
| 2016/0328928 | A1* | 11/2016 | Lutz | G08B 5/36 |
| 2016/0377280 | A1* | 12/2016 | Acampora | F21V 31/005 362/294 |
| 2017/0023228 | A1* | 1/2017 | Dyson | F21S 8/06 |
| 2017/0045214 | A1* | 2/2017 | Johnson | F21V 3/061 |
| 2017/0102136 | A1* | 4/2017 | Jiang | F21V 23/003 |
| 2017/0122534 | A1* | 5/2017 | Ticktin | F21V 21/22 |
| 2017/0138561 | A1* | 5/2017 | Van Strander | F21S 8/06 |
| 2017/0191624 | A1* | 7/2017 | Crayford | F21K 9/237 |
| 2017/0307181 | A1* | 10/2017 | Engle | F21V 17/002 |
| 2017/0321875 | A1* | 11/2017 | Rambusch | F21V 29/89 |

\* cited by examiner

US 10,260,723 B1

HIGH-LUMEN FIXTURE THERMAL MANAGEMENT

TECHNICAL FIELD

The present disclosure relates generally to lighting fixtures, and more particularly to light fixtures with thermal management features.

BACKGROUND

Traditional "high bay" light fixtures are composed of two large spaces. One of the large spaces is formed by a reflector/refractor encasing the light source of the light fixture, and the other large space is in an electronics compartment encasing the components that control the light source. Aside from the overall large space taken up by these spaces, the electronics housing is typically situated directly above the light source. In such light fixtures, the electronic components in the electronic housing are exposed to heat generated by the electronic components themselves and to heat generated by the light sources. Even with solid state light sources, the thermal loads generated by the light source reduce the effective life of the electronics, and in turn, the effective life of the complete light fixture.

Thus, a lighting structure or fixture that reduces the damaging effects of heat generated by the light source of the lighting fixture on the electronic components of the lighting fixture may extend the effective life of the electronics and the lighting fixture.

SUMMARY

This present disclosure relates to lighting fixtures with thermal management features. In some example embodiments, a lighting fixture structure for a suspended lighting fixture includes an electronics housing for containing lighting electronics. The lighting fixture structure further includes a thermal barrier positioned around a portion of the electronics housing. The lighting fixture structure also includes a heat sink. The electronics housing is separated from the thermal barrier by a first air gap, and the thermal barrier is separated from the heat sink by a second air gap.

In another example embodiment, a suspended lighting fixture includes a light source. The suspended lighting fixture further includes an electronics housing for containing lighting electronics. The suspended lighting fixture also includes a thermal barrier positioned around a portion of the electronics housing. The lighting fixture structure further includes a heat sink. The light source is attached to the heat sink. The electronics housing is separated from the thermal barrier by a first air gap, and the thermal barrier is separated from the heat sink by a second air gap.

In another example embodiment, a method of assembling a lighting structure includes providing an electronics housing and placing a thermal barrier around the electronics housing. The thermal barrier is spaced from the electronics housing such that a first air gap exists between the thermal barrier and the electronics housing. The method also includes attaching the electronics housing to a heat sink. An inner perimeter of the heat sink is spaced from the thermal barrier such that a second air gap exists between the thermal barrier and the heat sink.

These and other aspects, objects, features, and embodiments will be apparent from the following description and the claims.

BRIEF DESCRIPTION OF THE FIGURES

Reference will now be made to the accompanying drawings, which are not necessarily drawn to scale, and wherein.

Figure 1:
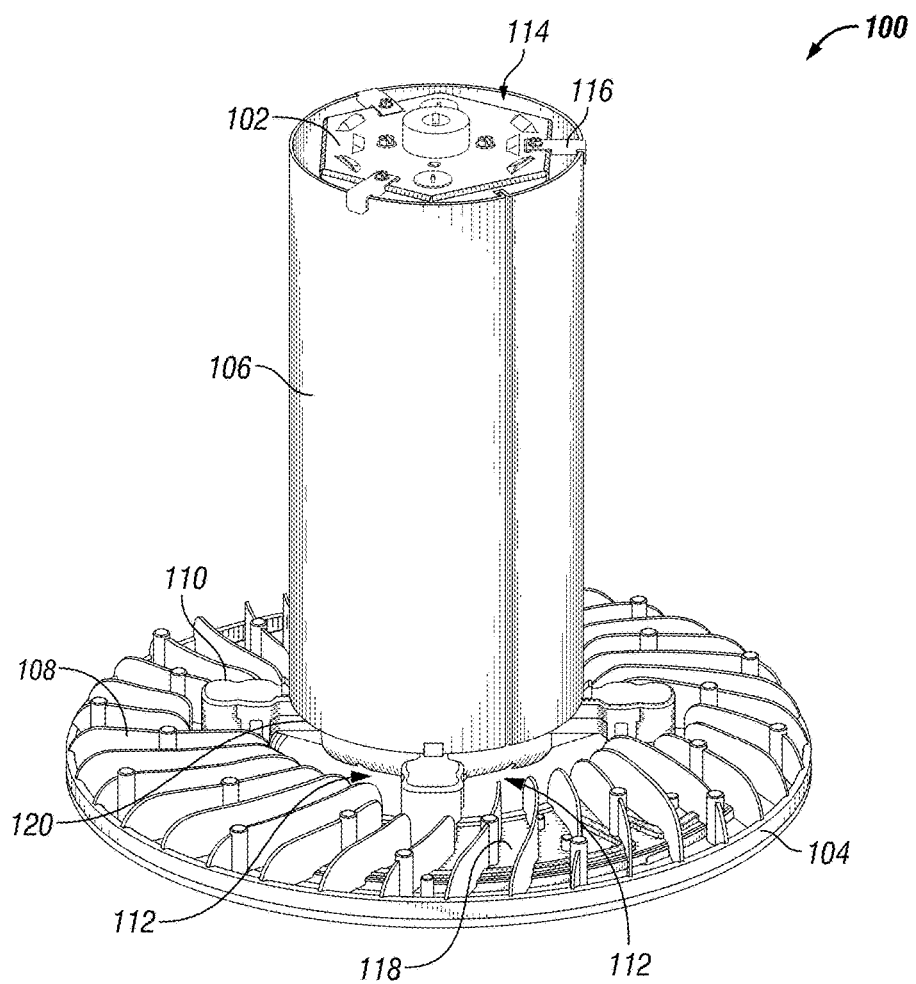
FIG. 1 is a top perspective view of a lighting fixture according to an example embodiment.

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, reference numerals designate like or corresponding, but not necessarily identical, elements.

DETAILED DESCRIPTION OF EXAMPLE EMBODIMENTS

In the following paragraphs, particular embodiments will be described in further detail by way of example with reference to the figures. In the description, well known components, methods, and/or processing techniques are omitted or briefly described. Furthermore, reference to various feature(s) of the embodiments is not to suggest that all embodiments must include the referenced feature(s).

Turning now to the drawings, FIG. 1 is a top perspective view of a lighting fixture according to an example embodiment. In some example embodiments, the lighting fixture 100 includes an electronics housing 102, a heat sink 104, and a thermal barrier 106. The electronics housing 102 may provide a compartment for electronic components of the lighting fixture 100. For example, a driver that provides power to the light source of the lighting fixture 100 may be positioned within the electronics housing 102.

In some example embodiments, the heat sink 104 is attached to the electronics housing 102 proximal to a bottom end of the electronics housing 102. For example, one or more bridges (more clearly shown in FIGS. 3 and 4) may extend below a bottom end of the thermal barrier 106 between the electronics housing 102 and the heat sink 104. As illustrated in FIG. 1, the heat sink 104 is separated from the thermal barrier 106 by an air gap 112 that allows air flow between the thermal barrier 106 and the heat sink 104.

In some example embodiments, the thermal barrier 106 is positioned around the electronics housing 102. For example, the thermal barrier 106 may be positioned around the electronics housing 102 for a substantial vertical length of the electronics housing 102. As illustrated in FIG. 1, the thermal barrier 106 is separated from the electronics housing 102 by an air gap 114. For example, the electronics housing 102 may be attached to the thermal barrier 106 using one or more brackets 116 that extend between the electronics housing 102 and the thermal barrier 106. The bracket 116 may extend across the air gap 114 that is between the electronics housing 102 and the thermal barrier 106.

The brackets 116 are positioned to reduce impact of the brackets 116 on air flow through the air gap 114 while providing structural integrity. In some example embodiments, using the bracket 116 may reduce the physical contact between the electronics housing 102 and the thermal barrier 106, which in turn may limit the amount of heat transfer between the electronics housing 102 and the thermal barrier 106. In some alternative embodiments, the electronics housing 102 and the thermal barrier 106 may be attached to each other by means other than the brackets 116 without departing from the scope of this disclosure. Further, in some alternative embodiments, the electronics housing 102 and the thermal barrier 106 may be attached to each other by the brackets 116 or other means at locations other than shown in FIG. 1 without departing from the scope of this disclosure.

In some example embodiments, the air gap 114 may extend around the entire outer perimeter of the electronics housing 102 along the entire vertical length of the thermal barrier 106. Alternatively, the air gap 114 may extend along the entire vertical length of the thermal barrier 106 between a section of the electronics housing 102 and a section of the thermal barrier 106. For example, the air gap 114 may extend along the entire vertical length of the thermal barrier 106 only one side of the lighting fixture 100. Further, the air gap 114 may include multiple air gap segments that are separated from each other. For example, the multiple air gap segments may be separated from each other by vertical separators/wall that extend along a vertical length of the thermal barrier 106 or the electronics housing 102.

In some example embodiments, the air gap 112 between the thermal barrier 106 and the heat sink 104 may extend around the thermal barrier 106 interrupted only by the bridges that extend between the electronics housing 102 and the heat sink 104. For example, the air gap 112 may allow air flow therethrough such that at least a portion of the heat generated by components (e.g., light sources) that are below the heat sink 104 pass through the air gap 112 on the outside of the thermal barrier 106 instead of entering the thermal barrier 106. Further, because the air gap 112 provides a separation between the thermal barrier 106 and the heat sink 104, heat dissipated by the top side of the heat sink 104 generally travels on the outside of the thermal barrier 106 separated from the electronics housing 102.

In some example embodiments, the heat sink 104 includes multiple fins 108 and a base 118. The fins 108 are positioned above the base 118 to more efficiently dissipate heat transferred to the fins 108 from the base 118. To illustrate, a light source may be disposed below the base 118. For example, one or more wireways 110 may be used to route one or more electrical wires to the light source that is below the base 118 of the heat sink 104. Heat generated by the light source may be transferred to the base 118 of the heat sink 104, and at least a portion of the heat may then be transferred to the fins 108. The horizontal separation between the thermal barrier 106 and the heat sink 104 provided by the air gap 112 allows hot air resulting from heat dissipated by the heat sink 104 to travel on the outside of the thermal barrier 106 separated from air flowing through the thermal barrier 106.

In some example embodiments, a bottom edge 120 of the thermal barrier 106 may be extend, relative to a vertical axis, below the base 118 of the heat sink 104 while maintaining a horizontal separation provided by the air gap 112. In some alternative embodiments, the bottom edge 120 of the thermal barrier 106 may extend, with respect to a vertical axis, to the same level as the base 118 of the heat sink 104 while maintaining a horizontal separation provided by the air gap 112. In yet some other alternative embodiments, the bottom edge 120 of the thermal barrier 106 may be extend, with respect to a vertical axis, above the base 118 of the heat sink 104 while maintaining a horizontal separation provided by the air gap 112. In some example embodiments, it is preferable to have the bottom edge 120 of the thermal barrier 106 vertically close to the same level as the base 118 of the heat sink 104 while maintaining a horizontal separation between the thermal barrier 106 and the heat sink 104 provided by the air gap 112.

In some example embodiments, the thermal barrier 106 is made from a material that has low thermal conductivity. For example, the thermal barrier 106 may be made from a polymer. The thermal barrier 106 may be made by extrusion and other methods that may be contemplated by those of ordinary skill in the art with the benefit of this disclosure. For example, the thermal barrier 106 may be made from a sheet of a thermally insulating material and rolled into the shape shown in FIG. 1 and attached at the opposite ends. Alternatively, the thermal barrier 106 may be made from two or more segments that are attached to each other.

The heat sink 104 is made from a thermally conductive material that can effectively dissipate heat generated by the light source. For example, the heat sink 104 may be made from aluminum. To illustrate, the heat sink 104 may be made from aluminum using die casting. The heat sink 104 may also be a machined heat sink. Alternatively, the heat sink 104 may be made by stamping, in particular, in embodiments of the lighting fixture 100 where the heat generated by the light source does not require the fins 108 or similar structures. Although the heat sink 104 is shown as having a particular shape and configuration of components/segments, in some alternative embodiments, the heat sink 104 may have other shapes or configuration without departing from the scope of this disclosure. For example, the heat sink 104 may have a non-circular outer perimeter and/or may have fins that have different shapes and configurations than shown in FIG. 1.

The thermal barrier 106 serves to segregate air flow between the inside and outside of the thermal barrier 106. Because the heat sink 104 is separated from the thermal barrier 106 by the air gap 112 such that the heat sink 104 is not directly below the thermal barrier 106, the thermal barrier 106 can keep the heat generated dissipated by the heat sink 104 on the outside of the thermal barrier 106 away from the electronics housing 102. By keeping heat dissipated by the heat sink 104 away from the electronics housing 102, unwanted impact of the heat dissipated by the heat sink 104 on the electronic components housed in the electronics housing 102 is reduced. Further, by allowing air flow through the air gap 114 within the thermal barrier 106, ambient air may flow around the electronics housing 102 from the bottom end 120 of the thermal barrier 106 to the top end of the thermal barrier 106, which may have a cooling effect on the electronics housing 102 and components housed within the electronics housing 102. To illustrate, ambient air is drawn into the central portion of the thermal barrier 106 via a "thermal chimney" created by the warming air rising inside the thermal barrier 106. This cylindrical thermal shield allows the electronic components in the electronics housing 102 to operate below the components' maximum temperature.

In some example embodiments, the lighting fixture 100, which may be a suspended lighting fixture, may be made by placing the thermal barrier 106 around the electronics housing 102, where the thermal barrier 106 is spaced from the electronics housing 102 such that the air gap 114 exists between the thermal barrier 106 and the electronics housing 102. The electronics housing 102 may be attached to the heat sink 104, where an inner perimeter 302 (shown in FIG. 3) of the heat sink 104 is spaced from the thermal barrier 106 such that the air gap 112 exists between the thermal barrier 106 and the heat sink 104. In some example embodiments, the light source (more clearly shown in FIG. 2A) may be attached to the heat sink 104 before or after the heat sink 104 is attached to the electronics housing 102. Electrical wires may be routed the electronics housing 102 to the light source through the wireways 110 and connected to the light source.

Although the thermal barrier 106 is shown in FIG. 1 as having a cylindrical shape, in alternative embodiments, the thermal barrier 106 may have other shapes without departing from the scope of this disclosure. For example, the thermal barrier 106 may have a rectangular or triangular cross-section. Further, in some alternative embodiments, the electronics housing 102 may have a shape other than shown in FIG. 1.

Figure 2A:
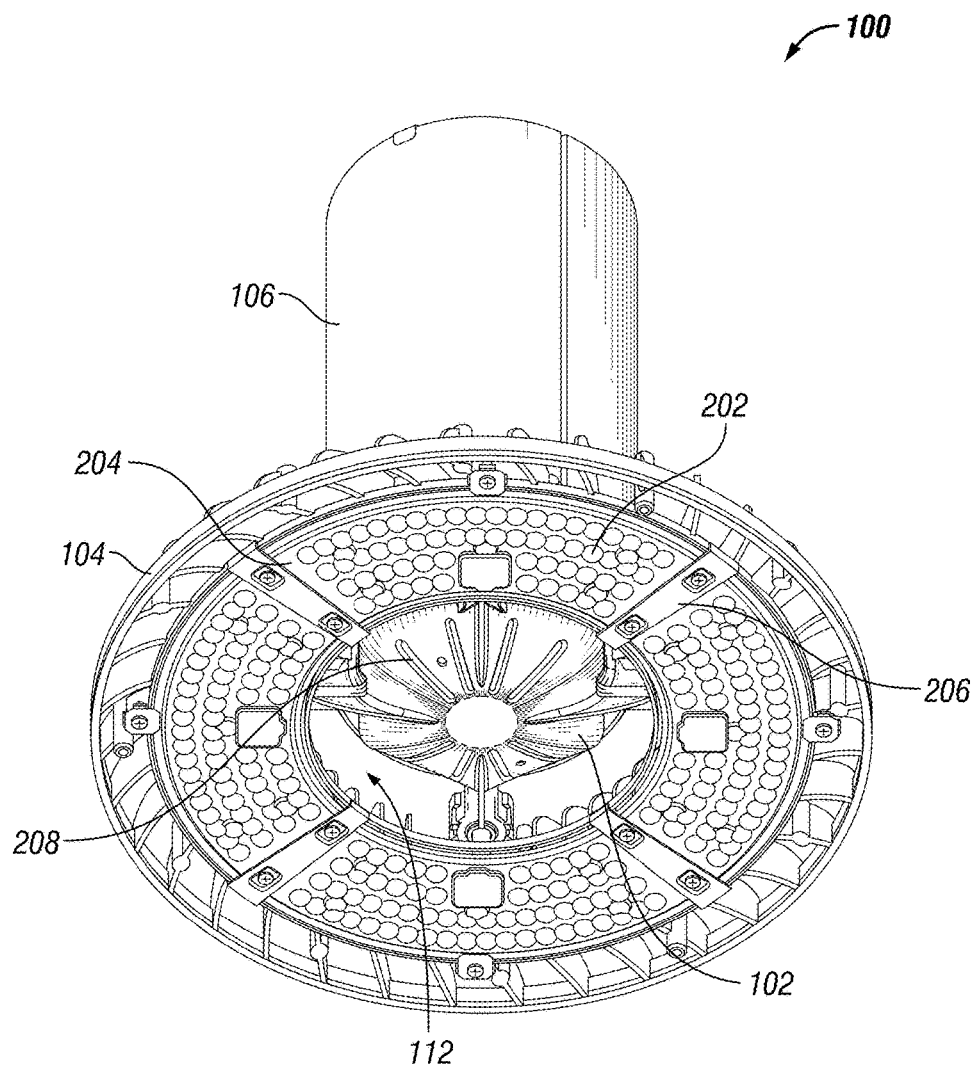
FIG. 2A is a bottom perspective view of the lighting fixture of FIG. 1 according to an example embodiment.
Figure 2B:
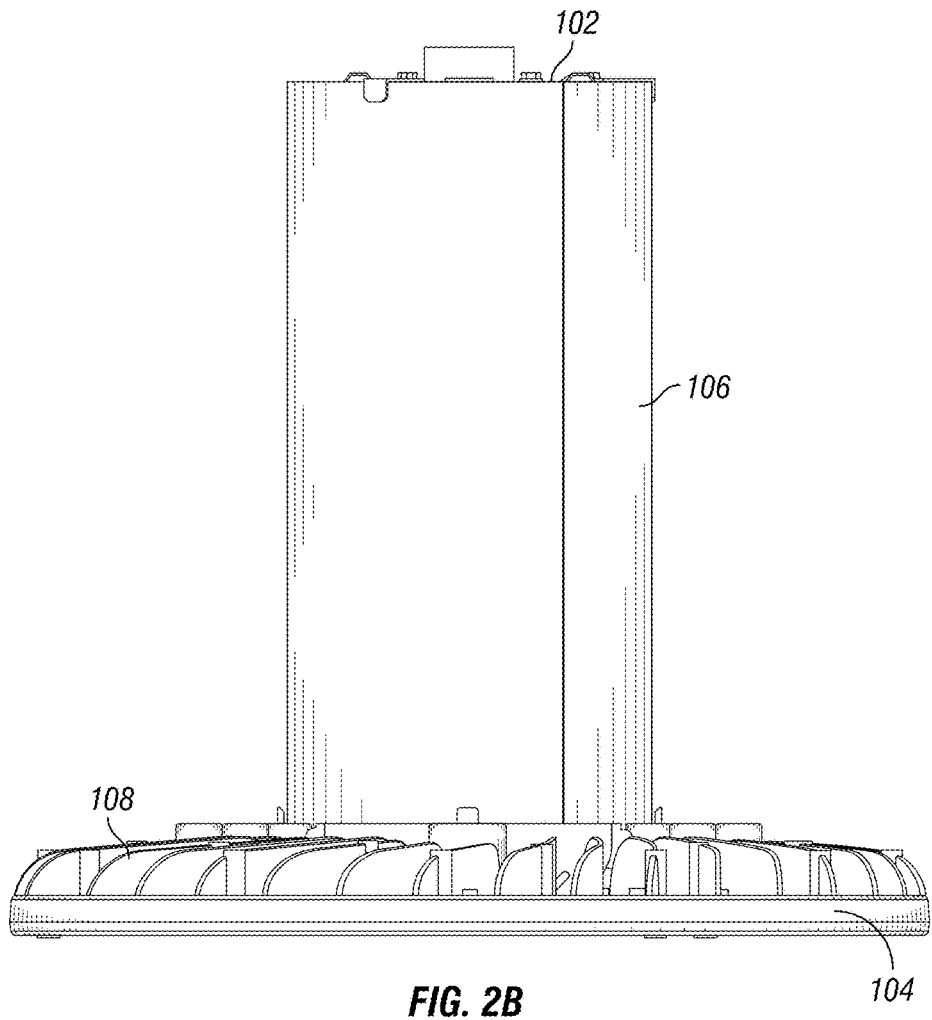
FIG. 2B is a side view of the lighting fixture of FIG. 1 according to an example embodiment.

FIG. 2A is a bottom perspective view of the lighting fixture 100 of FIG. 1 according to an example embodiment. FIG. 2B is a side view of the lighting fixture 100 of FIG. 1 according to an example embodiment. Referring to FIGS. 2A and 2B, the thermal barrier 106 extends in an upward direction relative to the heat sink 104. In some example embodiments, the lighting fixture 100 includes one or more light sources 202 that are attached to the heat sink 104. The lighting fixture 100 also includes a lens 204 covering the light sources 202. The lens 204 may be attached to the heat sink 104 in a number of ways. For example, the lens 204 may be attached to the heat sink 104 using one or more brackets 206.

In some example embodiments, the light sources 202, which are covered by the lens 204, may include one or more light emitting diodes (LEDs), one or more organic light-emitting diodes (OLEDs), an LED chip on board that includes one or more discrete LEDs, an array of discrete LEDs, or another light source that may be used in place of LEDs. The lens 204 may be from acrylic or another suitable material. In some example embodiments, the lens 204 may include multiple segments. For example, the lens 204 may include four segments that each fit in a quadrant of the heat sink 104. Alternatively, the lens 204 may be a single piece.

The heat sink 104 forms as a ring around the center of the lighting fixture 100 such that the electronics housing 102 and the thermal barrier 106 are not directly above heat sink 104. Because the light sources 202 are disposed on a bottom side of the heat sink 104, the light sources 202 also form a ring around the center of the lighting fixture 100 such that the light sources 202 are disposed directly below the electronics housing 102 and the thermal barrier 106. As described above, the air gap 112 provides a separation between the thermal barrier 106 and the heat sink 104 as well as between the electronics housing 102 and the heat sink 104, which allows heated air resulting from the heat dissipated by the heat sink 104 including the fins 108 to stay substantially on the outside of the thermal barrier 106.

As described above, the electronics housing 102 is disposed within the thermal barrier 106. In some example embodiments, the entire electronics housing 102 may be positioned within the cavity of the thermal barrier 106. Alternatively, a bottom end portion of the electronics housing 102 may be lined up with the bottom edge 120 (shown more clearly in FIG. 1) of the thermal barrier 106. In some other example embodiments, a bottom end portion of the electronics housing 102 may extend below the bottom edge 120 (shown more clearly in FIG. 1) of the thermal barrier 106.

In some example embodiments, the electronics housing 102 may include one or more openings 208 to allow air to enter the electronics housing 102. For example, the openings 208 may be disposed on a bottom side of the electronics housing 102. Because the electronics housing 102 and the thermal barrier 106 are not directly above the heat sink 104 or the light sources 202, air that enters the electronics housing 102 through the openings 208 is generally air that is unaffected by heat generated by the lighting sources 202 or dissipated by the heat sink 104. The air that enters the electronics housing 102 through the openings 208 may have a cooling effect on the electronic components (e.g., an LED driver) disposed in the electronics housing 102.

In some alternative embodiments, a top portion of the electronics housing 102 may extend above the top edge of the thermal barrier 106. For example, the top portion of the electronics housing 102 may have a dome shape or another shape that sticks above the top edge of the thermal barrier 106. In yet other alternative embodiments, the top side of the electronics housing 102 may be fully below the top edge of the thermal barrier 106 or lined up with the top edge of the thermal barrier 106. For example, the top side of the electronics housing 102 may be fully within the cavity of the thermal barrier 106.

Although the light sources 202 are shown in a particular configuration, in some alternative embodiments, the light sources 202 may have a different configuration. Further, some of the light sources 202 may be omitted or additional lights sources may be included. In some alternative embodiments, the lens 204 may be omitted or may have shapes other than shown in FIG. 2A. In some example embodiments, the electronics housing 102 may include fewer or more openings 208 than shown in FIG. 2A. Further, the openings 208 may have shapes and sizes other than shown in FIG. 2A. In some example embodiments, the air gap 112 may be bigger or smaller than shown in FIG. 2A without departing from the scope of this disclosure.

Figure 3:
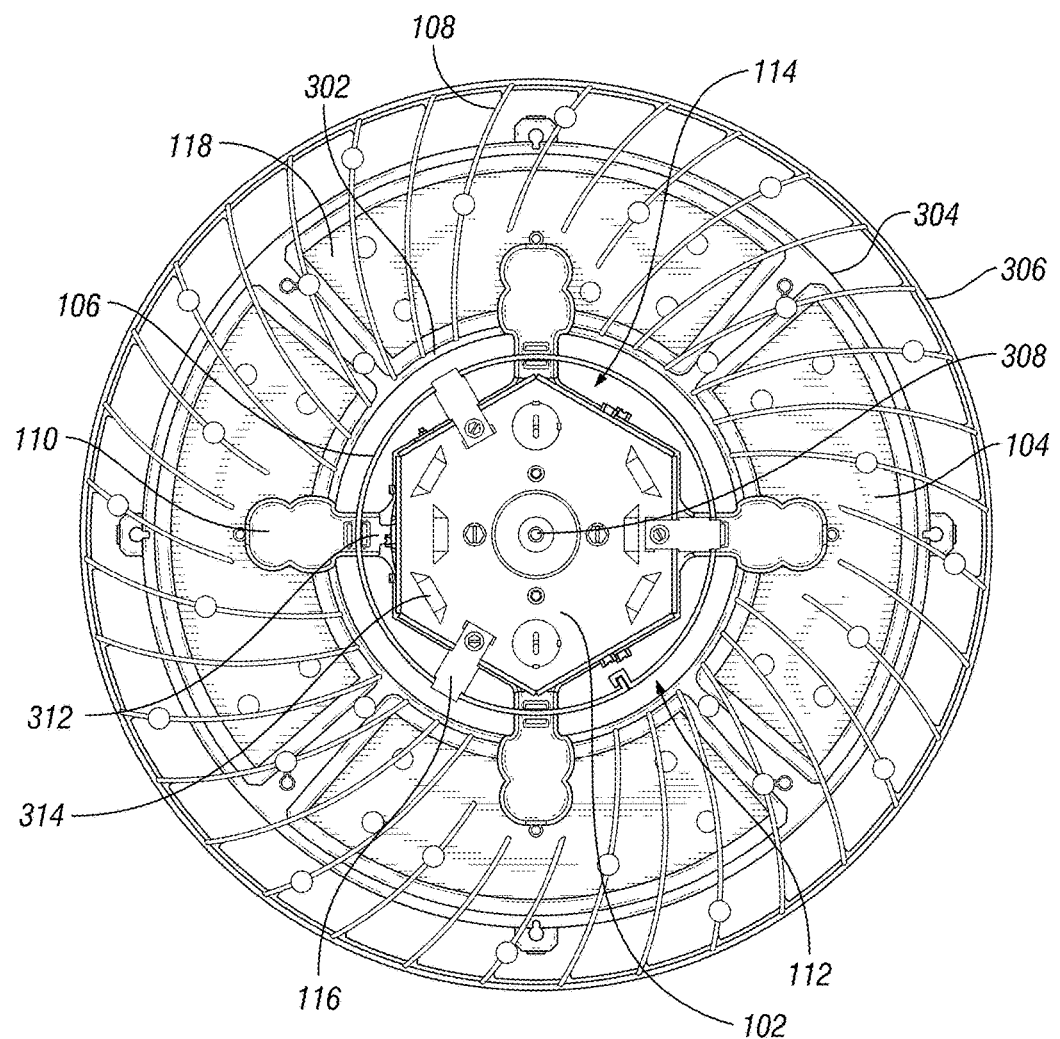
FIG. 3 is a top view of the lighting fixture of FIG. 1 according to an example embodiment.

FIG. 3 is a top view of the lighting fixture 100 of FIG. 1 according to an example embodiment. As illustrated in FIG. 3, the lighting fixture 100 includes the electronics housing 102, the heat sink 104, and the thermal barrier 106. The thermal barrier 106 is separated from the heat sink 104 by the air gap 112 that surrounds the thermal barrier 106. To illustrate, an internal perimeter 302 of the heat sink 104 is horizontally offset from the thermal barrier 106 and separated from the thermal barrier 106 by the air gap 112.

In some example embodiments, the electronics housing 102 includes a wire passage 308 for routing one or more electrical wires into the electronics housing 102. For example, an electrical wire may be routed to an LED driver (not shown) that is inside the electronics housing 102 through the wire passage 308. In some example embodiments, the wire passage 308 may be used to attach a hook or another structure that may be used for suspending the lighting fixture 100 from a mounting structure. For example, the wire passage 308 may be threaded to receive a threaded structure that includes open center for routing one or more electrical wires.

In some example embodiments, one or more electrical wires may be routed to the light sources 202 (shown in FIG. 2A) via the one or more wireways 110. For example, an electrical wire may be routed to the heat sink 104 from the electronics housing 102 via one of the wireways 110 and passed to the light source 202 via an opening in the heat sink 104. In some alternative embodiments, power may be provided to the light sources 202 by other means as may be contemplated by those of ordinary skill in the art with the benefit of this disclosure. Although the wireways 110 are shown having a particular shape, in alternative embodiments, the wireways 110 may have other shapes without departing from the scope of this disclosure.

In some example embodiments, the electronics housing 102 is attached to the heat sink 104 via one or more bridges 312. For example, the bridges 312 may extend between the electronics housing 102 and the heat sink 104 underneath the bottom edge 120 (shown in FIG. 1) of the thermal barrier 106. For example, the bottom edge 120 of the thermal barrier 106 may rest on the bridges 312. By limiting the physical connection between the electronics housing 102 and the heat sink 104 to just the one or more bridges 312, heat transfer from heat sink 104 to the electronics housing 102 may be limited. In some example embodiments, the bridges 312 may also serve as part of the wireways 110. In some example embodiments, the electronics housing 102 may be attached to the heat sink 104 by means other than the bridges 312 or at locations other than shown in FIG. 3.

In some example embodiments, the heat sink 104 may include an outer ring 306 that is separated from an outer perimeter 304 of the base 118 of the heat sink 104. The fins 108 may extend from across the separation between the outer ring 306 and the outer perimeter 304.

As illustrated in FIG. 3, the brackets 116 may extend between the electronics housing 102 and the thermal barrier 106. For example, the brackets 116 may be attached to a top side of the electronics housing 102 using one or more fasteners, and an opposite end of each bracket 116 may extend down from the top edge of the thermal barrier 106.

In some example embodiments, the electronics housing 102 includes one or more vents 314 allow air to exit the electronics housing 102. For example, the vents 314 may be formed on a top side of the electronics housing 102. Alternatively or in addition, the vents 314 may be formed on a side wall of the electronics housing 102 facing the thermal barrier 106. Air may enter the electronics housing 102, for example, through the openings 208 (shown in FIG. 2A) and exit the electronics housing 102 through the vents 314.

The vents 314 allow air heated by heat generated by the electronic components inside the electronics housing 102 to exit the electronics housing 102, thereby preventing excessive heat from building up within the electronics housing 102. Further, as the hotter air exits the electronics housing 102 through the vents 314, cooler air may enter the electronics housing 102 through the openings 208, thereby having a cooling down effect on the electronic components within the electronics housing 102.

As illustrated in FIG. 3, the air gap 114 may extend all the way through the thermal barrier 106 between the thermal barrier 106 and the electronics housing 102. As hot air rises up within the thermal barrier 106 through the air gap 114, cooler air may enter the air gap 114 having a cooling effect on the electronics housing 102, and thereby, on the electronic components inside the electronics housing 102.

The horizontal separation between the thermal barrier 106 and the heat sink 104 by the air gap 112 along with the air gap 114 between the thermal barrier 106 and the electronics housing 102 allow heated air resulting from the heat generated by the light sources 202 (shown in FIG. 3) and dissipated by the heat sink 104 to be substantially segregated from the electronics housing 102. Further, the air gap 114 allows cooler air to rise up through the thermal barrier 106 resulting in pulling up cooler air into the thermal barrier 106, which has a cooling effect on the electronics housing 102 and the electronic components inside electronics housing 102.

In some example embodiments, the air gap 112 and the air gap 114 may each be symmetric with respect to the center of the lighting fixture 100 and may be concentric with each other. Alternatively, the air gaps 112, 114 may be asymmetric and/or non-concentric without departing from the scope of this disclosure. Further, the electronics housing 102, the thermal barrier 106, and the heat sink 104 may have other shapes and relative dimensions than shown in FIG. 3 without departing from the scope of this disclosure.

Figure 4:
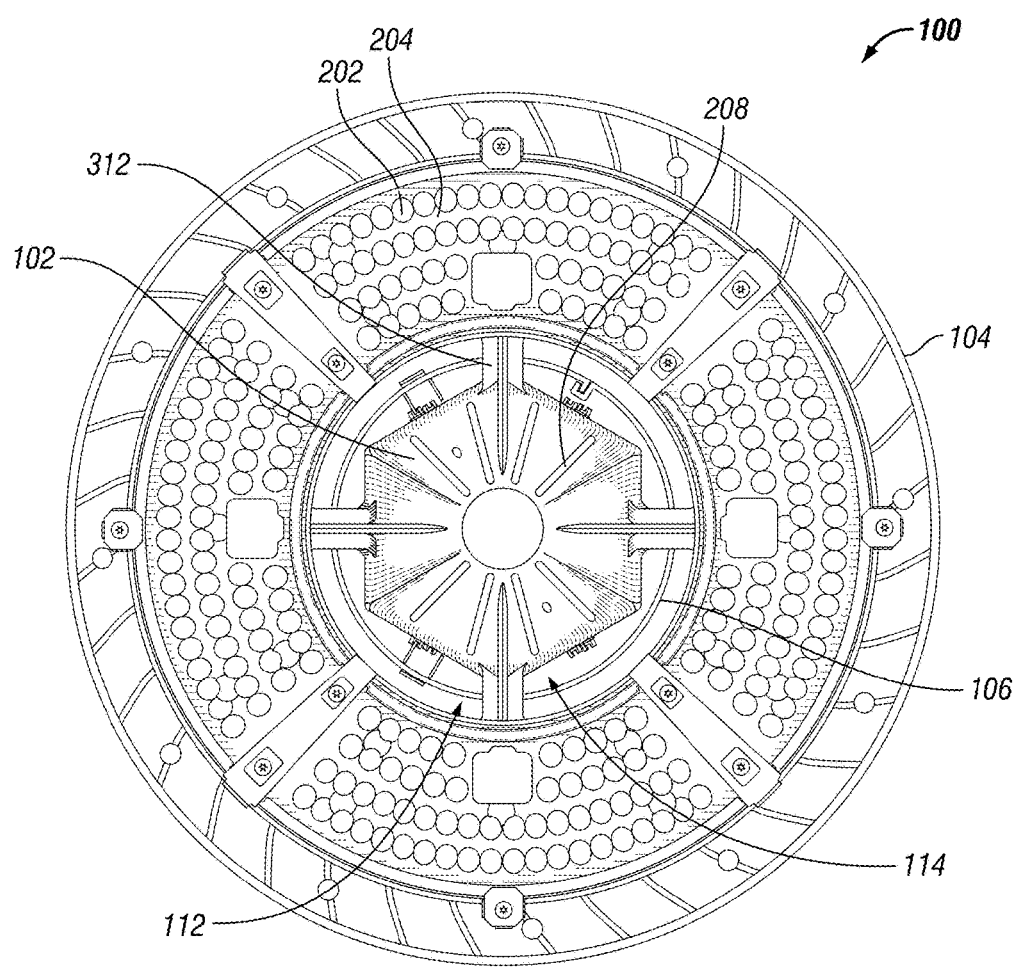
FIG. 4 is a bottom view of the lighting fixture of FIG. 1 according to an example embodiment.

FIG. 4 is a bottom view of the lighting fixture 100 of FIG. 1 according to an example embodiment. As illustrated in FIG. 4, the air gap 112 is on the outside of the thermal barrier 106, and the air gap 114 is within the thermal barrier 106. Referring to FIGS. 3 and 4, the openings 208 allow air to enter the electronics housing 102 from a bottom side of the electronics housing 102, and the vents 314 allow the air to exit the electronics housing 102, thereby reducing the amount of heat that accumulates within the electronics housing 102. The bridges 312 extend between the bottom end portion of the electronics housing 102 and the heat sink 104 and provide structural connection between the electronics housing 102 and the heat sink 104.

The light sources 202, which are covered by the lens 204, may generate heat that is mostly transferred to the heat sink 104 and dissipated by the heat sink 104 on the outside of the thermal barrier 106. The horizontal separation between the heat sink 104 and the thermal barrier 106 by the air gap 112 allows heat resulting from the light sources 202 but not transferred to the heat sink 104 to rise on a side of the heat sink 104 through the air gap 112.

Figure 5A:
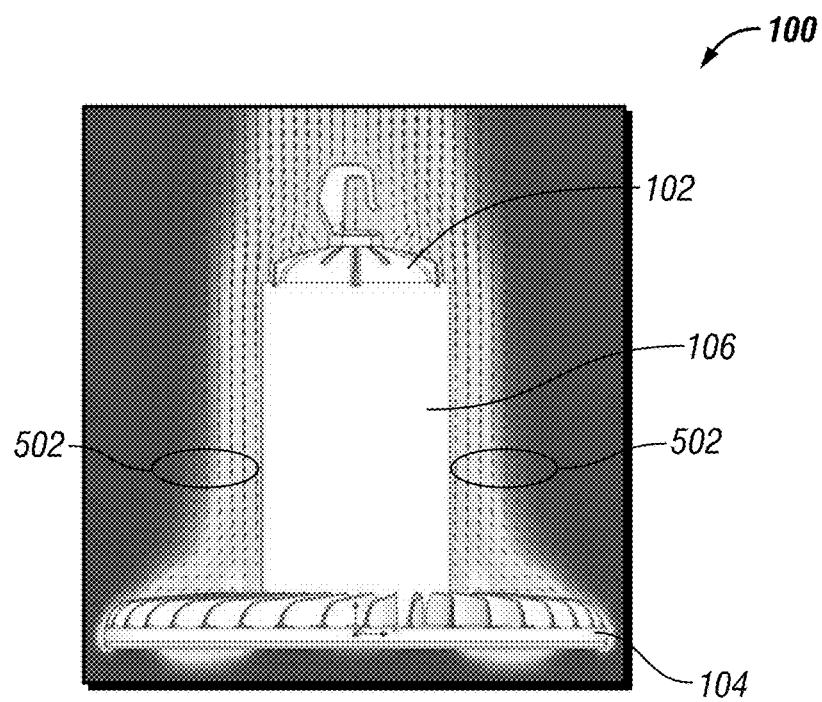
FIG. 5A-5C illustrate air flow through and around the lighting fixture of FIG. 1 according to an example embodiment.
Figure 5B:
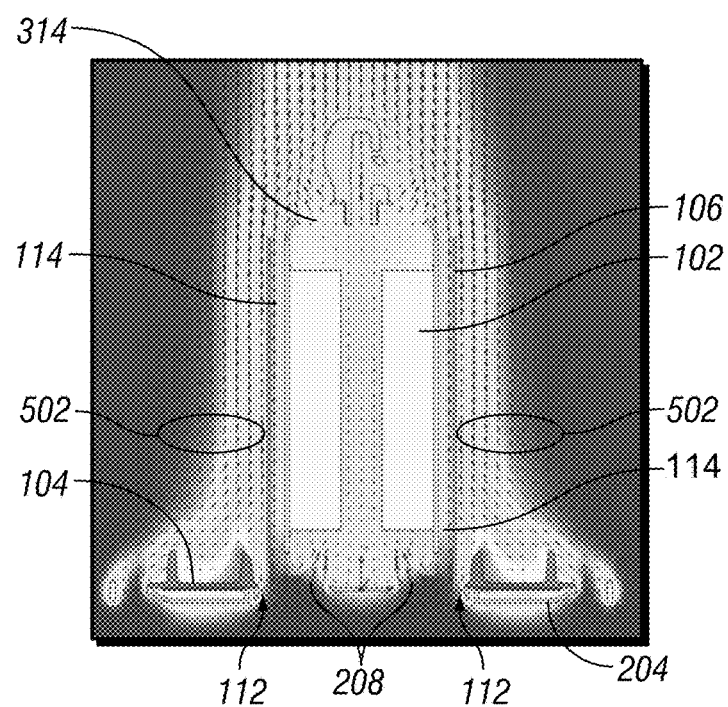
Figure 5C:
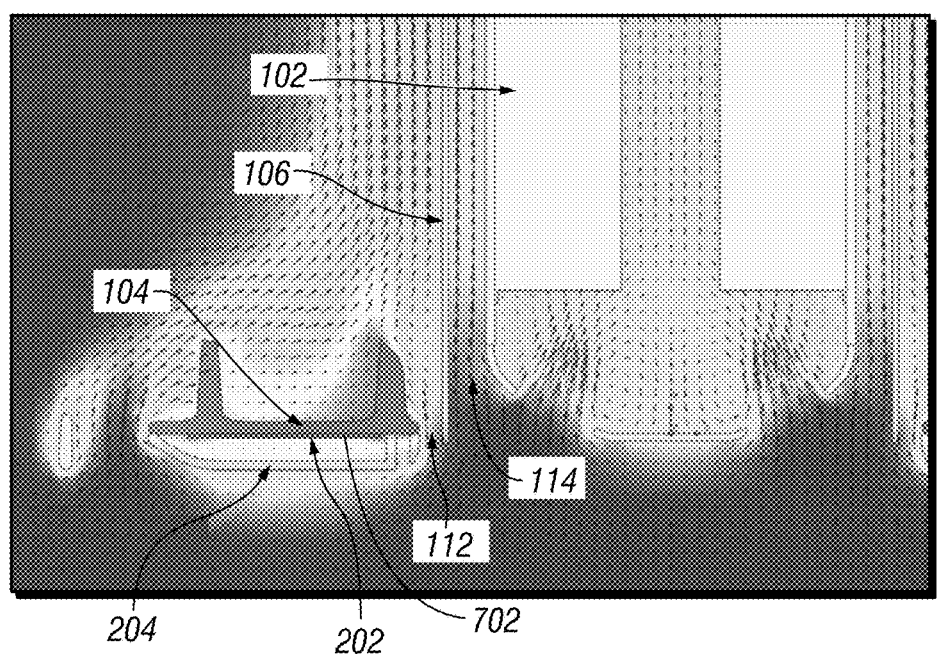

FIGS. 5A-5C illustrate air flow through and around a lighting fixture 100 according to an example embodiment. As illustrated in FIGS. 5A-5C, heated air 502 that is dissipated by the heat sink 104 rises on the outside of the thermal barrier 106. As described above, heat generated by the light sources 202 may be transferred to the heat sink 104 for dissipation by the heat sink 104. For example, the light sources 202 may include a printed circuit board 702 that is in contact with the bottom surface of the heat sink 104. Further, heat dissipated into the air by the lighting sources 202 may be transferred to the heat sink 104 and also rise around the heat sink 104. For example, some of the heat generated by the lighting source 202 may rise through the air gap 112 and on the outside of the thermal barrier 106 instead of into the thermal barrier 106 because of the horizontal separation between the thermal barrier 106 and light sources 202 as well as the heat sink 104.

Air that enters the air gap 114 between the electronics housing 102 and the thermal barrier 106 may be heated as it rises through the air gap 114, thereby removing heat from the thermal barrier 106 and the exterior wall of the electronics housing 102 as it exits the air gap 114 on the top side of the thermal barrier 106. Further, air that enters the electronics housing 102 through openings 208 may rise up through the electronics housing 102 and exit through the vents 314, thereby removing heat from the electronics housing 102.

By keeping air heated by the heat dissipated by the heat sink 104 on the outside of the thermal barrier 106 away from the electronics housing 102, by providing a separation between the thermal barrier 106 and the electronics housing 102 and allowing cooler air to enter the thermal barrier 106 on the bottom side and to exit through the top side, electronic components that are inside the electronics housing 102 are exposed to less heat than in a lighting fixture without these features. A lighting fixture that includes the lighting structure including the electronics housing 102, the heat sink 104, and the thermal barrier 106 with the air gaps 112, 114 as described above allows electronic components of the light fixture that are inside the electronics housing 102 to have a longer life than similar components that get exposed to excessive heat.

Although particular embodiments have been described herein in detail, the descriptions are by way of example. The features of the embodiments described herein are representative and, in alternative embodiments, certain features, elements, and/or steps may be added or omitted. Additionally, modifications to aspects of the embodiments described herein may be made by those skilled in the art without departing from the spirit and scope of the following claims, the scope of which are to be accorded the broadest interpretation so as to encompass modifications and equivalent structures.

What is claimed is:

1. A lighting fixture structure for a suspended lighting fixture, comprising:
    an electronics housing for containing lighting electronics;
    a thermal barrier positioned around a portion of the electronics housing, wherein at least the portion of the electronics housing is positioned in a cavity of the thermal barrier; and
    a heat sink positioned outside the electronics housing and the thermal barrier, wherein the electronics housing is separated from the thermal barrier by a first air gap, and wherein the thermal barrier is separated from the heat sink by a second air gap.

2. The lighting fixture structure of claim 1, wherein the first air gap allows air flow through the thermal barrier from a bottom opening of the thermal barrier to a top opening of the thermal barrier.

3. The lighting fixture structure of claim 2, wherein the first air gap surrounds the electronics housing.

4. The lighting fixture structure of claim 1, wherein the second air gap allows air flow between the heat sink and the thermal barrier along an outside of the thermal barrier.

5. The lighting fixture structure of claim 1, wherein the electronics housing includes a vent to allow air to exit the electronics housing.

6. The lighting fixture structure of claim 5, wherein the electronics housing includes an opening to allow air to enter the electronics housing, wherein the opening is formed on a bottom side of the electronics housing.

7. The lighting fixture structure of claim 5, wherein the vent is formed on a top side of the electronics housing.

8. The lighting fixture structure of claim 5, wherein the vent is formed on a side wall of the electronics housing, the side wall of the electronics housing facing the thermal barrier.

9. The lighting fixture structure of claim 1, further comprising a wireway for routing one or more wires from the electronics housing to the heat sink, wherein the wireway crosses the first air gap and the second air gap.

10. The lighting fixture structure of claim 1, wherein an opening on a top side of the electronics housing provides a pathway for extending a wire into the electronics housing.

11. A suspended lighting fixture, comprising:
    a light source;
    an electronics housing for containing lighting electronics;
    a thermal barrier positioned around a portion of the electronics housing, wherein at least the portion of the electronics housing is positioned in a cavity of the thermal barrier; and
    a heat sink positioned outside the electronics housing and the thermal barrier, wherein the light source is attached to the heat sink, wherein the electronics housing is separated from the thermal barrier by a first air gap, and wherein the thermal barrier is separated from the heat sink by a second air gap.

12. The suspended lighting fixture of claim 11, wherein the first air gap allows air flow through the thermal barrier from a bottom opening of the thermal barrier to a top opening of the thermal barrier.

13. The suspended lighting fixture of claim 12, wherein the first air gap surrounds the electronics housing.

14. The suspended lighting fixture of claim 11, wherein the second air gap allows air flow between the heat sink and the thermal barrier along an outside of the thermal barrier.

15. The suspended lighting fixture of claim 11, wherein the electronics housing includes a vent to allow air to exit the electronics housing.

16. The suspended lighting fixture of claim 15, wherein the electronics housing includes an opening to allow air to enter the electronics housing, wherein the opening is formed on a bottom side of the electronics housing.

17. The suspended lighting fixture of claim 15, wherein the vent is formed on a top side of the electronics housing.

18. A method of assembling a suspended lighting fixture, comprising:
    providing an electronics housing;
    placing a thermal barrier around the electronics housing such that the electronics housing is inside a cavity of the thermal barrier, wherein the thermal barrier is spaced from the electronics housing such that a first air gap exists between the thermal barrier and the electronics housing; and
    attaching the electronics housing to a heat sink, wherein the heat sink is positioned outside of the electronics housing and the thermal barrier and wherein an inner perimeter of the heat sink is spaced from the thermal barrier such that a second air gap exists between the thermal barrier and the heat sink.

19. The method of claim 18, further comprising attaching a light source to the heat sink.

20. The method of claim 19, further comprising routing an electrical wire from the electronics housing to the light source through a wireway extending between the electronics housing to the heat sink, wherein the wireway crosses the first air gap and the second air gap.

* * * * *